US006551863B2

United States Patent
Johnson et al.

(10) Patent No.: US 6,551,863 B2
(45) Date of Patent: Apr. 22, 2003

(54) FLIP CHIP DIP COATING ENCAPSULANT

(75) Inventors: Farrah J. Johnson, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,481

(22) Filed: Aug. 30, 2001

(65) Prior Publication Data

US 2003/0045027 A1 Mar. 6, 2003

(51) Int. Cl.[7] .......................... H01L 21/44; H01L 21/48; H01L 21/50
(52) U.S. Cl. ...................... 438/127; 438/108; 438/124; 438/126; 438/613; 228/180.1; 228/180.21; 228/180.22
(58) Field of Search ................... 438/108, 124, 438/126, 127, 613; 228/180.1, 180.21, 180.22

(56) References Cited

U.S. PATENT DOCUMENTS

| 4,724,613 | A |   | 2/1988 | Dale ........................... 29/856 |
| 5,496,775 | A |   | 3/1996 | Brooks ........................ 437/219 |
| 5,672,393 | A |   | 9/1997 | Bachmann et al. ........... 427/493 |
| 5,888,850 | A | * | 3/1999 | Havens et al. ............... 438/127 |
| 5,933,713 | A | * | 8/1999 | Farnworth ................... 438/127 |
| 6,063,828 | A |   | 5/2000 | Ma et al. ...................... 522/96 |
| 6,100,114 | A |   | 9/2000 | Milkovich et al. .......... 438/127 |
| 6,168,972 | B1 | * | 1/2001 | Wang et al. ................. 438/108 |
| 6,172,141 | B1 |   | 1/2001 | Wong et al. ................. 523/455 |
| 6,245,595 | B1 | * | 6/2001 | Nguyen et al. .............. 438/108 |
| 6,248,614 | B1 |   | 6/2001 | Kodnani et al. ............. 438/107 |
| 6,255,142 | B1 |   | 7/2001 | Babiarz et al. .............. 438/126 |

OTHER PUBLICATIONS

Jiang et al., US Application Publication 2002/0025602, Feb. 28, 2002.*

* cited by examiner

*Primary Examiner*—Kamand Cuneo
*Assistant Examiner*—David A. Zarneke
(74) *Attorney, Agent, or Firm*—Whyte Hirschboeck Dudek SC

(57) ABSTRACT

A method for underfilling and encapsulating a flip chip in one step is disclosed. The flip chip is immersed in a polymer bath to apply a coating of the polymer to the surface of the flip chip except for the distal end of the conductive projections on the flip chip electrically conductive pads. The coated flip chip is exposed to ultraviolet light or heat (e.g., IR radiation) to surface cure a skin over the polymer coating. The skin-cured flip chip is placed on a substrate which is then heated to reflow the conductive material from the projections and to cause the polymer from the coating to underfill the flip chip and thermally cure to encapsulate and underfill the flip chip.

56 Claims, 1 Drawing Sheet

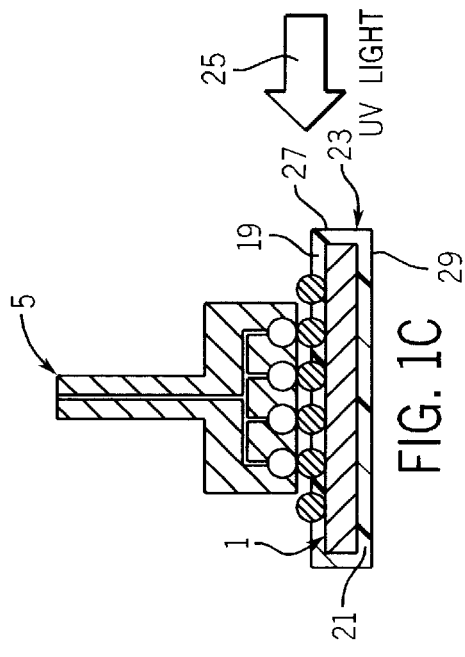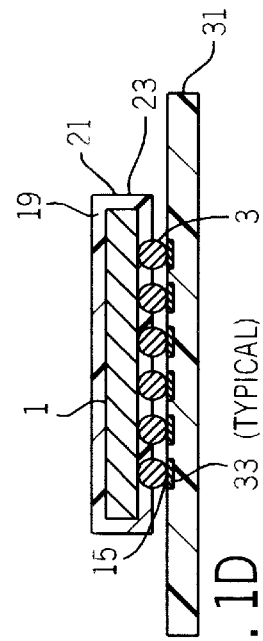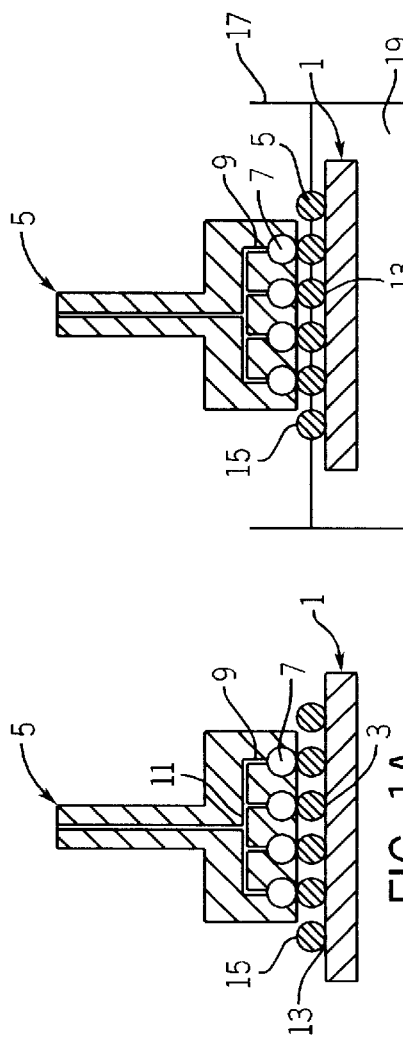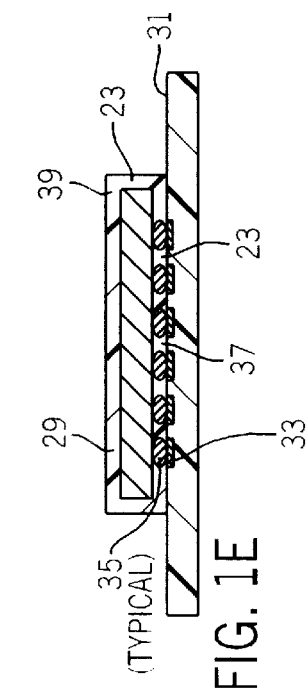

FLIP CHIP DIP COATING ENCAPSULANT

BACKGROUND OF THE INVENTION

This invention relates generally to semiconductor manufacturing, and more specifically to methods and apparatus for applying an encapsulant to a flip chip.

Typically, in flip chip packaging, one or more integrated circuits (IC) chips are mounted on a substrate to form an electronic substrate. Solder balls (also known as solder bumps), which are mounted on the electrical connection pads of the flip chip are aligned with the corresponding electrical connection pads on the substrate. The flip chip and the substrate are then heated to cause the solder to melt (or "reflow") and wet the electrical connection pads of the substrate. The substrate and flip chip are then cooled to solidify the solder thereby forming the desired electrical connections.

As with any IC chip mounted on a substrate surface, differences in the thermal expansion coefficients between the chip and the surface can cause stress and fatigue in these connections as the substrate is subjected to further heat/cool cycles during subsequent processing. A common method of reducing this stress, and providing better adhesion, is to fill the gap between the chip and the mounting surface with a suitable polymeric underfill resin.

Furthermore, IC chips mounted on substrates are frequently coated with a polymeric encapsulation resin to protect the IC chip from outside contamination and mechanical stress. However, separate application of the underfill and the encapsulant requires extra process steps. Additionally, the encapsulant may not be compatible with the underfill.

Known methods which apply the underfill and the encapsulant simultaneously typically require extra steps for masking the electrical contact area of the solder balls or else require etching steps to remove encapsulant from these areas. Therefore, a method for simultaneously underfilling and encapsulating an IC chip without masking or removal steps is desirable.

BRIEF SUMMARY OF THE INVENTION

In one preferred embodiment, the invention is a method for encapsulating and underfilling a lip chip, the method comprising the steps of: providing a flip chip having projections of conductive material on one side of the flip chip, the projections having a proximate end attached to the flip chip and a distal end opposite the proximate end; immersing the flip chip in a polymer bath, wherein the polymer bath covers the flip chip and part of the projections up to a point between the proximate end of the projection and the distal end of the projection; removing the flip chip from the polymer bath such that a coating of polymer adheres to the flip chip and the part of the projections covered by the polymer bath to form a coated flip chip having the distal ends of the projections uncoated; applying ultraviolet light or heat (e.g., IR radiation) to the coated flip chip such that an outer layer of the coating cures to form a skin-cured flip chip; placing the skin-cured flip chip on a substrate board to form an assembly; heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

In another preferred embodiment, the invention is a method for encapsulating and underfilling a flip chip, the method comprising the steps of: providing a flip chip having projections of conductive material on one side of the flip chip, the projections having a proximate end attached to the flip chip and a distal end opposite the proximate end; providing a pick-up tip, the pick-up tip having indentations corresponding to the projections on the flip chip, wherein the indentations are in fluid communication with a vacuum source; positioning the pick-up tip in contact with, or close proximity to, the flip chip such that the indentations align with and partially cover the projections; applying a vacuum through the indentations such that the flip chip is secured to the pick-up tip; repositioning the pick-up tip such that the flip chip secured to the pick-up tip is immersed in a polymer bath, wherein the polymer bath covers the flip chip and part of the projections up to a point between the proximate end of the projection and the distal end of the projection; removing the flip chip from the polymer bath such that a coating of polymer adheres to the flip chip and the part of the projections covered by the polymer bath to form a coated flip chip having the distal ends of the projections are uncoated; applying ultraviolet light or heat (e.g., IR radiation) to the coated flip chip such that an outer layer of the coating cures to form a skin-cured flip chip; releasing the skin-cured flip chip from the pick-up tip; placing the skin-cured flip chip on a substrate board to form an assembly; heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

In another preferred embodiment, the invention is a method for encapsulating and underfilling a flip chip, the method comprising the steps of: providing a flip chip having projections of conductive material on one side of the flip chip, the projections having a proximate end attached to the flip chip and a distal end opposite the proximate end; securing the flip chip to a pick-up tip by means of a vacuum; positioning the pick-up tip such that the flip chip attached thereto is partially immersed in a polymer bath to a level between the proximate end and the distal end of the projections; removing the flip chip from the polymer bath such that a coating of the polymer remains in contact with the flip chip such that the distal ends of the projections are uncoated; applying ultraviolet light or heat (e.g., IR radiation) to the coated flip chip such that an outer layer of the coating cures to form a skin-cured flip chip; releasing the skin-cured flip chip from the pick-up tip; placing the skin-cured flip chip on a substrate board to form an assembly; heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

In another preferred embodiment, the invention is a method for encapsulating and underfilling a flip chip, the method comprising the steps of: providing a flip chip having projections of conductive material on one side of the flip chip, the projections having a proximate end attached to the flip chip and a distal end opposite the proximate end; providing a pick-up tip, the pick-up tip having indentations corresponding to the projections on the flip chip, the indentations in fluid communication with a vacuum source; positioning the pick-up tip in contact with, or close proximity to, the flip chip such that the indentations align with and partially cover the solder balls; applying a vacuum through the indentations such that the flip chip is secured to the pick-up tip; repositioning the pick-up tip such that the flip chip secured to the pick-up tip is partially immersed in a polymer bath such that the immersed chip is fully wetted by the polymer, the flip chip being immersed to a point such that the pick-up tip and the distal ends of the projections extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip; removing the flip chip from the polymer bath such that a coating of the polymer remains in contact with the flip chip such that the distal ends of the projections are uncoated; applying ultraviolet light or heat (e.g., IR radiation) to the coated flip chip such that an outer layer of the coating cures to form a skin-cured flip chip; releasing the skin-cured flip chip from the pick-up tip; placing the skin-cured flip chip on a substrate board to form an assembly; and applying thermal energy to the assembly, wherein the thermal energy causes the solder and the polymer to flow and also cures the polymer.

In another preferred embodiment, the invention is a method for encapsulating and underfilling a flip chip, the method comprising the steps of: providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end; providing a pick-up tip, the tip having indentations corresponding to the projections on the flip chip, wherein small holes are defined within the indentations; positioning the tip in contact with, or close proximity to, the flip chip such that the indentations align with the projections; applying a vacuum through the indentations such that the flip chip is secured to the tip and the indentations partially cover the projections; repositioning the tip such that the flip chip secured to the tip is immersed in a polymer bath, the flip chip being immersed to a point between the proximate end of the projections and the distal end of the projections such that the distal ends of the projections are not in contact with the polymer, the polymer bath being vibrated ultrasonically to facilitate wetting of the chip around the balls, the polymer bath having a viscosity sufficiently high such that the polymer is not pulled into the vacuum; removing the flip chip from the polymer bath such that a coating of the polymer remains in contact with the flip chip such that the distal ends of the projections are uncoated; applying ultraviolet light or heat (e.g., IR radiation) to the coated flip chip such that an outer layer of the coating cures to form a skin-cured flip chip; releasing the skin-cured flip chip from the pick-up tip; placing the skin-cured flip chip on a substrate board to form an assembly; and applying thermal energy to the assembly, wherein the thermal energy causes the solder and the polymer to flow and also cures the polymer to encapsulate the coated chip.

In another preferred embodiment, the invention is a process for forming a semiconductor device, the process consisting of the steps of: providing a wafer having an upper surface, the upper surface having at least one flip chip arrayed thereon, wherein the flip chip comprises solder balls attached to a surface of the flip chip, the solder balls having a distal section and having a height above the surface of the flip chip; picking the flip chip from the upper surface of the wafer with a pick-up tip, the pick-up tip comprising indentations adapted to fit the solder balls on the flip chip, the indentations further comprising holes in fluid communication with a vacuum source; applying a vacuum through the holes in the indentations such that the flip chip is secured to the pick-up tip and the indentations at least partially cover the distal portion of the solder balls; immersing the flip chip secured to the pick-up tip in a polymer bath such that the immersed chip is fully wetted by the polymer, the flip chip being immersed to a point such that the pick-up tip and the distal ends of the solder balls, up to about one-half the height of the solder balls, extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip; removing the flip chip from the polymer bath such that a coating of the polymer remains in contact with the flip chip except for the distal ends of the solder balls; exposing the flip chip to having a coating of the polymer to ultraviolet light or heat (e.g., IR radiation) such that at least a portion of the polymer cures to form an outer skin of cured coating, thereby forming a coated chip; placing the coated chip onto a mounting surface; applying thermal energy to the coated chip on the mounting surface, wherein the thermal energy causes the solder and the polymer to reflow and also cures the polymer to encapsulate the coated chip.

In another preferred embodiment the invention is a method for encapsulating and underfilling a batch of flip chips, the method comprising the steps of: providing a multiplicity of flip chips, each flip chip having projections of conductive material on one side of the flip chip, the projections having a proximate end attached to the flip chip and a distal end opposite the proximate end; immersing the multiplicity of flip chips simultaneously in a polymer bath, wherein the polymer bath covers the flip chips and part of the projections up to a point between the proximate end of the projection and the distal end of the projection; removing the multiplicity of flip chips from the polymer bath such that a coating of polymer adheres to each flip chip and the part of the projections covered by the polymer bath to form coated flip chips having the distal ends of the projections uncoated; applying ultraviolet light or heat (e.g., IR radiation) to the multiplicity of coated flip chips such that an outer layer of each coating cures to form a skin-cured flip chip; placing the skin-cured flip chips on one or more substrate boards to form at least one assembly; heating the assembly such that: (i) the conductive material forms an electrical junction between the flip chips and the at least one substrate; (ii) the polymer from the polymer coating on the flip chip underfills and encapsulates the flip chips; and, (iii) the polymer from the coating cures.

In still another preferred embodiment the invention is a method for encapsulating and underfilling a batch of flip chips, the method comprising the steps of: providing a multiplicity of flip chip, each flip chip having projections of conductive material on one side of the flip chip, the projections having a proximate end attached to the flip chip and a distal end opposite the proximate end; providing at least one pick-up tip, the pick-up tip having indentations corresponding to the projections on the flip chips, wherein the indentations are in fluid communication with a vacuum source; positioning the at least one pick-up tip in contact with, or close proximity to, the flip chips such that the indentations align with and partially cover the projections; applying a vacuum through the indentations such that the flip chips are secured to the at least one pick-up tip; repositioning the at least one pick-up tip such that the multiplicity of flip chips secured to the pick-up tip are simultaneously immersed in a polymer bath, wherein the polymer bath covers the flip chips and part of the projections up to a point between the proximate end of the projection and the distal end of the projection; removing the flip chips from the polymer bath such that a coating of polymer adheres to each flip chip and the part of the projections covered by the polymer bath to form coated flip chips having the distal ends of the projections are uncoated; applying ultraviolet light or heat (e.g., IR radiation) to the coated flip chips such that an outer layer of the coatings cure to form a skin-cured flip chip; releasing the skin-cured flip chips from the at least one pick-up tip; placing the skin-cured flip chips on at least one substrate board to form at least one assembly; heating the at least one assembly such that: (i) the conductive material forms an electrical junction between the flip chips and the at least one substrate; (ii) the polymer from the polymer coatings on the flip chips underfills and encapsulates the flip chips; and, (iii) the polymer from the coatings cures.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIGS. 1A–1E are flowcharts of the inventive process showing individual steps as schematic views.

FIG. 1A is a schematic view of a flip chip being held by a pick-up tip.

FIG. 1B is a schematic view of the flip chip of FIG. 1A partially immersed in a polymer bath.

FIG. 1C is a schematic view of the flip chip of FIG. 1B being exposed to ultraviolet light or heat (e.g., IR radiation).

FIG. 1D is a schematic view of the flip chip of FIG. 1C positioned on a substrate surface.

FIG. 1E is a schematic view of the flip chip of FIG. 1D subsequent to reflow.

DETAILED DESCRIPTION OF THE INVENTION

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that electrical or structural changes may be made without departing from the spirit and scope of the present invention.

The terms "wafer" or "wafer substrate" used in the following description include any semiconductor-based structure having a silicon surface. Wafer and wafer substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or wafer substrate in the following description, previous process steps may have been used to form regions or junctions in the base semiconductor structure or foundation.

FIG. 1 shows a flowchart of one preferred embodiment of the method of this invention. As show in FIG. 1A, flip chip 1 has a number of projections of conductive material, illustrated in this case by solder balls 3, attached over electrical conducting pads (not shown) on flip chip 1. Each solder ball 3 has a proximate end 13 in contact with flip chip 1 and a distal end 15 opposite the proximate end. Pick-up tip 5 is positioned over flip chip 1. Indentations 7 of pick-up tip 5 are aligned with solder balls 3 on flip chip 1. Holes 9 located in indentations 7 are in fluid communication via channels 11 to a vacuum source (not shown). Application of a vacuum through holes 9 attracts and holds flip chip 1 to pick-up tip 5. Typically, pick-up tip 5 will remove flip chip 1 from the upper surface of the wafer or wafer substrate where flip chip 1 was formed.

Although illustrated herein as solder balls 3, the projections of conductive material may be in any suitable shape, such as, bumps, spikes, balls, towers or stacks, etc. As used herein, the term "solder ball" refers to single or multiple balls of a conductive material located on an electrical conducting head of an IC chip. In the case where multiple balls are located on an individual electrical conducting pad, such balls are typically stacked one on top of the other. Typically, the projections comprise solder but may comprise other conducting materials such as gold, copper or aluminum. In the illustrative preferred embodiment, the projections comprise a single solder ball for each electrical conducting pad on flip chip 1. In another preferred embodiment, the "solder balls" comprise a stack of bonded gold balls located on each electrical conducting pad of flip chip 1 as disclosed in U.S. Pat. No. 5,496,775, incorporated herein by reference.

Pick-up tip 5 is used to move flip chip 1 and partially immerse flip chip 1 in a polymer bath as shown in FIG. 1B. The polymer bath comprises a liquid polymer resin 19 within a reservoir 17. Preferably, the polymer bath will be ultrasonically vibrated to facilitate wetting of the surfaces of flip chip 1 by liquid polymer resin 19. Flip chip 1 is immersed into liquid polymer 19 to a level between the proximate ends 13 and distal ends 15 of solder balls 3. Preferably, flip chip 1 is immersed to a level approximately halfway between the proximate ends 13 and distal ends 15 of solder balls 3. This positioning allows for the coating of all surfaces of flip chip 1 and solder balls 3 except for the tip of solder balls 3 located at the distal end 15.

The viscosity of liquid polymer resin 19 should be high enough such that liquid polymer resin 19 is not drawn into indentations 7, or over distal ends 15, by the vacuum provided through holes 9. One skilled in the art will be able to determine, by routine experimentation, a suitable polymer viscosity for a particular application based on the vacuum pressure imposed through holes 9, the distance between the proximate 13 and distal ends 15 of the solder balls 3 and the fit between indentations 7 and solder balls 3.

Liquid polymer resin 19 may be any polymer resin suitable for use as an underfill and/or encapsulant. Among such suitable polymer resins 19 known in the art are epoxies, polyimides, silicone-polyimide copolymers, polyetherimide, polysulfone, acrylic/urethane, preferably epoxies or polyimides.

Epoxy materials are thermosetting polymers meaning that they crosslink ("cure") when heated. The cured epoxy is an excellent adhesive for securing the IC chip to the mounting surface. The adhesive bond is formed as the epoxy is cured, typically at temperatures of 125–175° C. for 1 to 5 hours. Representative of suitable epoxy-based polymers is NoSweep available from K&S.

Polyimide materials are usually applied as a polyamic acid precursor in liquid form. During a high temperature cure step (e.g., 150° C. for 30 minutes and 300° C. for 60 minutes) the polyamic acid undergoes a chemical change (imidization) that causes it to become a solid polyimide resin. Representative of suitable polyimides is QM1536 which is a bismaleimide-based material available from Dexter Corporation of Industry, California.

Liquid polymer resin 19 is both photocurable and thermocurable. As such, liquid polymer resin 19 may additionally comprise curing agents such as photoinitiators and thermoinitiators. Suitable photoinitiators are well-known in the art and include phosphine oxide compounds and perfluorinated diphenyl titanocene compounds. Suitable thermoinitiators are typically free-radical initiators including peroxides, such as butyl peroctoates and dicumyl peroxide, and azo compounds.

As shown in FIG. 1C, flip chip 1 is removed from the polymer bath. A coating 21 of liquid polymer 19 adheres to flip chip 1 to form a coated flip chip 23. The coated flip chip 23 is exposed to ultraviolet light or heat (e.g., IR radiation) 25. The photoinitiators in liquid polymer resin 19 are activated by ultraviolet light or heat (e.g., IR radiation) 25 and react with the liquid polymer resin 19 to form a skin 27 of hardened resin 29 over coating 21. Skin 27 serves to secure coating 21 in place over the coated flip chip 23.

Coated flip chip 23 is released from pick-up tip 5 and is positioned on a substrate surface 31 as shown in FIG. 1D. The uncoated distal ends 15 of solder balls 3 on coated flip chip 23 are aligned with electrical contact pads 33 located on substrate surface 31.

The substrate and flip chip are heated to attach the coated flip chip 23 to substrate surface 31 as shown in FIG. 1E. The heat melts solder balls 3 causing the solder to wet the surfaces of substrate electrical pads 33. Subsequent cooling results in reflowed solder balls 35 permanently connecting electrical contact pads (not shown) on coated flip chip 23 to electrical contact pads 33 on substrate surface 31. The heat also allows the polymer resin in coating 21 to flow and fill in the gaps between coated chip 23 and substrate surface 31 thus forming underfill 37. The heat initiates the curing reactions of the polymer resin and/or activates any thermoinitiators in the polymer resin causing these thermoinitiators to react with and harden the resin. As such, underfill 37 and encapsulant 39 comprise hardened resin 29.

In a preferred embodiment, the inventive process is a batch process wherein multiple flip chips are processed simultaneously. The batch process is the same as disclosed above except that a plurality of flip chips 1 are secured to a plurality of pick-up tips 5 (shown in FIG. 1A for an individual chip). Alternatively, a single pick-up tip 5 may have multiple sets of indentations 7 to accommodate the solder balls 3 of multiple flip chips 1. The multiple flip chips 1 are then simultaneously partially immersed in the polymer bath up to a level between the proximate ends 13 and distal ends 15 on the solder balls 3 of the respective flip chips 1 (shown in FIG. 1B for an individual chip). The multiple flip chips 1 are removed from the polymer bath and simultaneously exposed to ultraviolet light or heat (e.g., IR radiation) 25 to activate the photoinitiators thereby forming skins 27 of hardened polymer 29 over the coatings 21 of the respective coated flip chips 23 (shown in FIG. 1C for an individual chip). The multiple coated flip chips 23 are released from the pick-up tip(s) 5 and positioned onto the respective substrate surfaces 31 (shown in FIG. 1D for an individual chip). Heating reflows the solder balls and the polymer underfill and initiates the curing reaction/thermoinitiators resulting in multiple mounted flip chips as shown, individually, in FIG. 1E.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for encapsulating and underfilling a flip chip, the method comprising the steps of:

providing a flip chip having projections of conductive material on one side of the flip chip, the projections having a proximate end attached to the flip chip and a distal end opposite the proximate end;

immersing the flip chip in a polymer bath, wherein the polymer bath covers the flip chip and part of the projections up to a point between the proximate end of the projection and the distal end of the projection;

removing the flip chip from the polymer bath such that a coating of polymer adheres to the flip chip and the part of the projections covered by the polymer bath to form a coated flip chip having the distal ends of the projections uncoated;

applying ultraviolet light or heat to the coated flip chip such that an outer layer of the coating cures to form a skin-cured flip chip;

placing the skin-cured flip chip on a substrate board to form an assembly;

heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

2. The method of claim 1 wherein the projections of conductive material are solder balls.

3. The method of claim 1 wherein the polymer bath is ultrasonically vibrated.

4. The method of claim 1 wherein the flip chip is immersed in the polymer bath to a point approximately one-half of the distance between the proximate end and the distal end of the projection.

5. The method of claim 1 wherein the projections of conductive material are located in contact with electrically conductive pads located on the flip chip.

6. The method of claim 1 wherein the skin-cured flip chip is positioned on the substrate board such that the projections align with electrically conductive pads on the substrate board.

7. A method for encapsulating and underfilling a flip chip, the method comprising the steps of:

providing a flip chip having projections of conductive material on one side of the flip chip, the projections having a proximate end attached to the flip chip and a distal end opposite the proximate end;

providing a pick-up tip, the pick-up tip having indentations corresponding to the projections on the flip chip, wherein the indentations are in fluid communication with a vacuum source;

positioning the pick-up tip in contact with, or close proximity to, the flip chip such that the indentations align with and partially cover the projections;

applying a vacuum through the indentations such that the flip chip is secured to the pick-up tip;

repositioning the pick-up tip such that the flip chip secured to the pick-up tip is immersed in a polymer bath, wherein the polymer bath covers the flip chip and part of the projections up to a point between the proximate end of the projection and the distal end of the projection;

removing the flip chip from the polymer bath such that a coating of polymer adheres to the flip chip and the part of the projections covered by the polymer bath to form a coated flip chip having the distal ends of the projections are uncoated;

applying ultraviolet light or heat to the coated flip chip such that an outer layer of the coating cures to form a skin-cured flip chip;

releasing the skin-cured flip chip from the pick-up tip;

placing the skin-cured flip chip on a substrate board to form an assembly;

heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

8. The method of claim 7 wherein the projections of conductive material are solder balls.

9. The method of claim 7 wherein the polymer bath is ultrasonically vibrated.

10. The method of claim 7 wherein the flip chip is immersed in the polymer bath to a point approximately one-half of the distance between the proximate end and the distal end of the projection.

11. The method of claim 7 wherein the projections of conductive material are located in contact with electrically conductive pads located on the flip chip.

12. The method of claim 7 wherein the skin-cured flip chip is positioned on the substrate board such that the projections align with electrically conductive pads on the substrate board.

13. A method for encapsulating and underfilling a flip chip, the method comprising the steps of:

providing a flip chip having projections of conductive material on one side of the flip chip, the projections having a proximate end attached to the flip chip and a distal end opposite the proximate end;

securing the flip chip to a pick-up tip by means of a vacuum;

positioning the pick-up tip such that the flip chip attached thereto is partially immersed in a polymer bath to a level between the proximate end and the distal end of the projections;

removing the flip chip from the polymer bath such that a coating of the polymer remains in contact with the flip chip such that the distal ends of the projections are uncoated;

applying ultraviolet light or heat to the coated flip chip such that an outer layer of the coating cures to form a skin-cured flip chip;

releasing the skin-cured flip chip from the pick-up tip;

placing the skin-cured flip chip on a substrate board to form an assembly;

heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

14. The method of claim 13 wherein the projections of conductive material are solder balls.

15. The method of claim 13 wherein the polymer bath is ultrasonically vibrated.

16. The method of claim 13 wherein the flip chip is immersed in the polymer bath to a point approximately one-half of the distance between the proximate end and the distal end of the projection.

17. The method of claim 13 wherein the projections of conductive material are located in contact with electrically conductive pads located on the flip chip.

18. The method of claim 13 wherein the skin-cured flip chip is positioned on the substrate board such that the projections align with electrically conductive pads on the substrate board.

19. A method for encapsulating and underfilling a flip chip, the method comprising the steps of:

providing a flip chip having projections of conductive material on one side of the flip chip, the projections having a proximate end attached to the flip chip and a distal end opposite the proximate end;

providing a pick-up tip, the pick-up tip having indentations corresponding to the projections on the flip chip, the indentations in fluid communication with a vacuum source;

positioning the pick-up tip in contact with, or close proximity to, the flip chip such that the indentations align with and partially cover the solder balls;

applying a vacuum through the indentations such that the flip chip is secured to the pick-up tip;

repositioning the pick-up tip such that the flip chip secured to the pick-up tip is partially immersed in a polymer bath such that the immersed chip is fully wetted by the polymer, the flip chip being immersed to a point such that the pick-up tip and the distal ends of the projections extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip;

removing the flip chip from the polymer bath such that a coating of the polymer remains in contact with the flip chip such that the distal ends of the projections are uncoated;

applying ultraviolet light or heat to the coated flip chip such that an outer layer of the coating cures to form a skin-cured flip chip;

releasing the skin-cured flip chip from the pick-up tip;

placing the skin-cured flip chip on a substrate board to form an assembly;

applying thermal energy to the assembly, wherein the thermal energy causes the solder and the polymer to flow and also cures the polymer.

20. The method of claim 19 wherein the projections of conductive material are solder balls.

21. The method of claim 19 wherein the polymer bath is ultrasonically vibrated.

22. The method of claim 19 wherein the flip chip is immersed in the polymer bath to a point approximately one-half of the distance between the proximate end and the distal end of the projection.

23. The method of claim 19 wherein the projections of conductive material are located in contact with electrically conductive pads located on the flip chip.

24. The method of claim 19 wherein the skin-cured flip chip is positioned on the substrate board such that the projections align with electrically conductive pads on the substrate board.

25. A method for encapsulating and underfilling a flip chip, the method comprising the steps of:
  providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end;
  securing the flip chip to a pick-up tip by means of a vacuum;
  positioning the pick-up tip such that the flip chip attached thereto is partially immersed in a polymer bath to a level between the proximate end and the distal end of the projections;
  removing the flip chip from the polymer bath such that a coating of the polymer remains in contact with the flip chip such that the distal ends of the projections are uncoated;
  applying ultraviolet light or heat to the coated flip chip such that an outer layer of the coating cures to form a skin-cured flip chip;
  releasing the skin-cured flip chip from the pick-up tip;
  placing the skin-cured flip chip on a substrate board to form an assembly;
  heating the assembly such that: (i) the conductive material forms an electrical junction between the flip chip and the substrate; (ii) the polymer from the polymer coating on the flip chip underfills and encapsulates the flip chip; and, (iii) the polymer from the coating cures.

26. The method of claim 25 wherein the projections of conductive material are solder balls.

27. The method of claim 25 wherein the flip chip is immersed in the polymer bath to a point approximately one-half of the distance between the proximate end and the distal end of the projection.

28. The method of claim 25 wherein the projections of conductive material are located in contact with electrically conductive pads located on the flip chip.

29. The method of claim 25 wherein the skin-cured flip chip is positioned on the substrate board such that the projections align with electrically conductive pads on the substrate board.

30. A method for encapsulating and underfilling a flip chip, the method comprising the steps of:
  providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end;
  providing a pick-up tip, the pick-up tip having indentations corresponding to the projections on the flip chip, the indentations in fluid communication with a vacuum source;
  positioning the pick-up tip in contact with, or close proximity to, the flip chip such that the indentations align with and partially cover the solder balls;
  applying a vacuum through the indentations such that the flip chip is secured to the pick-up tip;
  repositioning the pick-up tip such that the flip chip secured to the pick-up tip is partially immersed in a polymer bath such that the immersed chip is fully wetted by the polymer, the flip chip being immersed to a point such that the pick-up tip and the distal ends of the projections extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip;
  removing the flip chip from the polymer bath such that a coating of the polymer remains in contact with the flip chip such that the distal ends of the projections are uncoated;
  applying ultraviolet light or heat to the coated flip chip such that an outer layer of the coating cures to form a skin-cured flip chip;
  releasing the skin-cured flip chip from the pick-up tip;
  placing the skin-cured flip chip on a substrate board to form an assembly; applying thermal energy to the assembly, wherein the thermal energy causes the solder and the polymer to flow and also cures the polymer.

31. The method of claim 30 wherein the projections of conductive material are solder balls.

32. The method of claim 30 wherein the flip chip is immersed in the polymer bath to a point approximately one-half of the distance between the proximate end and the distal end of the projection.

33. The method of claim 30 wherein the projections of conductive material are located in contact with electrically conductive pads located on the flip chip.

34. The method of claim 30 wherein the skin-cured flip chip is positioned on the substrate board such that the projections align with electrically conductive pads on the substrate board.

35. A method for encapsulating and underfilling a flip chip, the method comprising the steps of:
  providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end;
  providing a pick-up tip, the tip having indentations corresponding to the projections on the flip chip, wherein small holes are defined within the indentations;
  positioning the tip in contact with, or close proximity to, the flip chip such that the indentations align with the projections;
  applying a vacuum through the indentations such that the flip chip is secured to the tip and the indentations partially cover the projections;
  repositioning the tip such that the flip chip secured to the tip is immersed in a polymer bath, the flip chip being immersed to a point between the proximate end of the projections and the distal end of the projections such that the distal ends of the projections are not in contact with the polymer, the polymer bath being vibrated ultrasonically to facilitate wetting of the chip around the balls, the polymer bath having a viscosity sufficiently high such that the polymer is not pulled into the vacuum;
  removing the flip chip from the polymer bath such that a coating of the polymer remains in contact with the flip chip such that the distal ends of the projections are uncoated;
  applying ultraviolet light or heat to the coated flip chip such that an outer layer of the coating cures to form a skin-cured flip chip;
  releasing the skin-cured flip chip from the pick-up tip;

placing the skin-cured flip chip on a substrate board to form an assembly;

applying thermal energy to the assembly, wherein the thermal energy causes the solder and the polymer to flow and also cures the polymer to encapsulate the coated chip.

36. The method of claim 35 wherein the projections of conductive material are solder balls.

37. The method of claim 35 wherein the flip chip is immersed in the polymer bath to a point approximately one-half of the distance between the proximate end and the distal end of the projection.

38. The method of claim 35 wherein the projections of conductive material are located in contact with electrically conductive pads located on the flip chip.

39. The method of claim 35 wherein the skin-cured flip chip is positioned on the substrate board such that the projections align with electrically conductive pads on the substrate board.

40. A method for encapsulating and underfilling a flip chip, the method comprising the steps of:

providing a wafer having an upper surface, the upper surface having at least one flip chip arrayed thereon, wherein the flip chip comprises solder balls attached to a surface of the flip chip, the solder balls having a distal section and having a height above the surface of the flip chip;

picking the flip chip from the upper surface of the wafer with a pick-up tip, the pick-up tip comprising indentations adapted to fit the solder balls on the flip chip, the indentations further comprising holes in fluid communication with a vacuum source;

applying a vacuum through the indentations such that the flip chip is secured to the pick-up tip and the indentations at least partially cover the distal portion of the solder balls;

immersing the flip chip secured to the pick-up tip in a polymer bath such that the immersed chip is fully wetted by the polymer, the flip chip being immersed to a point such that the pick-up tip and the distal ends of the solder balls, up to about one-half the height of the solder balls, extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip;

removing the flip chip from the polymer bath such that a coating of the polymer remains in contact with the flip chip except for the distal ends of the solder balls;

exposing the flip chip to having a coating of the polymer to ultraviolet light or heat such that at least a portion of the polymer cures to form an outer skin of cured coating, thereby forming a coated chip;

placing the coated chip onto a mounting surface;

applying thermal energy to the coated chip on the mounting surface, wherein the thermal energy causes the solder and the polymer to reflow and also cures the polymer to encapsulate the coated chip.

41. The method of claim 40 wherein the projections of conductive material are solder balls.

42. The method of claim 40 wherein the flip chip is immersed in the polymer bath to a point approximately one-half of the distance between the proximate end and the distal end of the projection.

43. The method of claim 40 wherein the projections of conductive material are located in contact with electrically conductive pads located on the flip chip.

44. The method of claim 40 wherein the skin-cured flip chip is positioned on the substrate board such that the projections align with electrically conductive pads on the substrate board.

45. A method for encapsulating and underfilling a batch of flip chips, the method comprising the steps of:

providing a multiplicity of flip chips, each flip chip having projections of conductive material on one side of the flip chip, the projections having a proximate end attached to the flip chip and a distal end opposite the proximate end;

immersing the multiplicity of flip chips simultaneously in a polymer bath, wherein the polymer bath covers the flip chips and part of the projections up to a point between the proximate end of the projection and the distal end of the projection;

removing the multiplicity of flip chips from the polymer bath such that a coating of polymer adheres to each flip chip and the part of the projections covered by the polymer bath to form coated flip chips having the distal ends of the projections uncoated;

applying ultraviolet light or heat to the multiplicity of coated flip chips such that an outer layer of each coating cures to form a skin-cured flip chip;

placing the skin-cured flip chips on one or more substrate boards to form at least one assembly;

heating the assembly such that: (i) the conductive material forms an electrical junction between the flip chips and the at least one substrate; (ii) the polymer from the polymer coating on the flip chip underfills and encapsulates the flip chips; and, (iii) the polymer from the coating cures.

46. The method of claim 45 wherein the projections of conductive material are solder balls.

47. The method of claim 45 wherein the polymer bath is ultrasonically vibrated.

48. The method of claim 45 wherein the flip chip is immersed in the polymer bath to a point approximately one-half of the distance between the proximate end and the distal end of the projection.

49. The method of claim 45 wherein the projections of conductive material are located in contact with electrically conductive pads located on the flip chip.

50. The method of claim 45 wherein the skin-cured flip chip is positioned on the substrate board such that the projections align with electrically conductive pads on the substrate board.

51. A method for encapsulating and underfilling a batch of flip chips, the method comprising the steps of:

providing a multiplicity of flip chip, each flip chip having projections of conductive material on one side of the flip chip, the projections having a proximate end attached to the flip chip and a distal end opposite the proximate end;

providing at least one pick-up tip, the pick-up tip having indentations corresponding to the projections on the flip chips, wherein the indentations are in fluid communication with a vacuum source;

positioning the at least one pick-up tip in contact with, or close proximity to, the flip chips such that the indentations align with and partially cover the projections;

applying a vacuum through the indentations such that the flip chips are secured to the at least one pick-up tip;

repositioning the at least one pick-up tip such that the multiplicity of flip chips secured to the pick-up tip are simultaneously immersed in a polymer bath, wherein the polymer bath covers the flip chips and part of the projections up to a point between the proximate end of the projection and the distal end of the projection;

removing the flip chips from the polymer bath such that a coating of polymer adheres to each flip chip and the part of the projections covered by the polymer bath to form coated flip chips having the distal ends of the projections are uncoated;

applying ultraviolet light or heat to the coated flip chips such that an outer layer of the coatings cure to form a skin-cured flip chip;

releasing the skin-cured flip chips from the at least one pick-up tip;

placing the skin-cured flip chips on at least one substrate board to form at least one assembly;

heating the at least one assembly such that: (i) the conductive material forms an electrical junction between the flip chips and the at least one substrate; (ii) the polymer from the polymer coatings on the flip chips underfills and encapsulates the flip chips; and, (iii) the polymer from the coatings cures.

52. The method of claim 51 wherein the projections of conductive material are solder balls.

53. The method of claim 51 wherein the polymer bath is ultrasonically vibrated.

54. The method of claim 51 wherein the flip chip is immersed in the polymer bath to a point approximately one-half of the distance between the proximate end and the distal end of the projection.

55. The method of claim 51 wherein the projections of conductive material are located in contact with electrically conductive pads located on the flip chip.

56. The method of claim 51 wherein the skin-cured flip chip is positioned on the substrate board such that the projections align with electrically conductive pads on the substrate board.

* * * * *

UNITED STATES PATENT AND TRADEMARK OFFICE
CERTIFICATE OF CORRECTION

PATENT NO. : 6,551,863 B2
DATED : April 22, 2003
INVENTOR(S) : Farrah J. Johnson and Tongbi Jiang It is certified that error appears in the above-identified patent and that said Letters Patent is hereby corrected as shown below:

Column 1,
Line 45, replace "lip" with -- flip --.

Signed and Sealed this

Seventeenth Day of June, 2003

JAMES E. ROGAN
*Director of the United States Patent and Trademark Office*